(12) United States Patent
Okumura et al.

(10) Patent No.: US 7,023,226 B2
(45) Date of Patent: Apr. 4, 2006

(54) PROBE PINS ZERO-POINT DETECTING METHOD, AND PROBER

(75) Inventors: Katsuya Okumura, Tokyo (JP); Kunihiro Furuya, Nirasaki (JP)

(73) Assignees: Octec Inc., Tokyo (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/968,315

(22) Filed: Oct. 20, 2004

(65) Prior Publication Data

US 2005/0052195 A1    Mar. 10, 2005

Related U.S. Application Data

(63) Continuation of application No. PCT/JP2004/001534, filed on Feb. 13, 2004.

(30) Foreign Application Priority Data

Feb. 20, 2003 (JP) .............................. 2003-042285

(51) Int. Cl.
*G01R 31/02* (2006.01)
(52) U.S. Cl. ..................................... 324/756
(58) Field of Classification Search ................ 324/756, 324/757, 758
See application file for complete search history.

(56) References Cited

U.S. PATENT DOCUMENTS

| | | | | |
|---|---|---|---|---|
| 6,160,415 A | * | 12/2000 | Jung | 324/765 |
| 6,523,420 B1 | * | 2/2003 | Lee et al. | 73/831 |
| 6,777,968 B1 | * | 8/2004 | Kobayashi et al. | 324/758 |

FOREIGN PATENT DOCUMENTS

| | | |
|---|---|---|
| JP | 4-340734 | 11/1992 |
| JP | 2002-139542 A | 5/2002 |
| JP | 2004-093450 | 3/2004 |
| JP | 2004-156984 | 6/2004 |

* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

A zero-point detecting method of this invention is performed prior to testing the electrical characteristics of a wafer by bringing an object to be tested on a stage and probes of a probe card into contact with each other. The surface of a zero-point detection plate is made of a conductive material (e.g., copper). The zero-point detection plate is used to detect a zero point as a position where the surface of the object to be tested comes into contact with the probe pins.

7 Claims, 9 Drawing Sheets

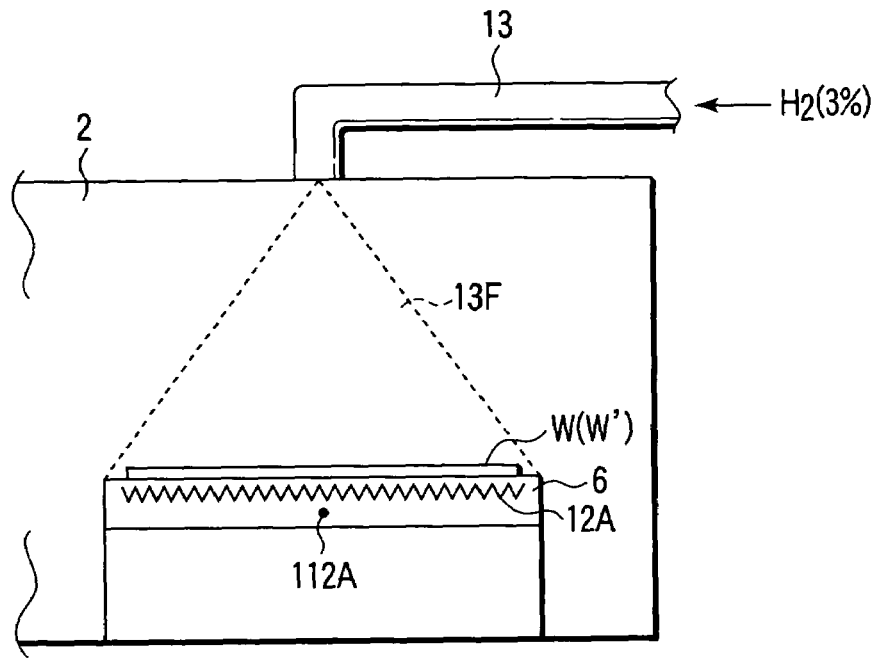
F I G. 4A
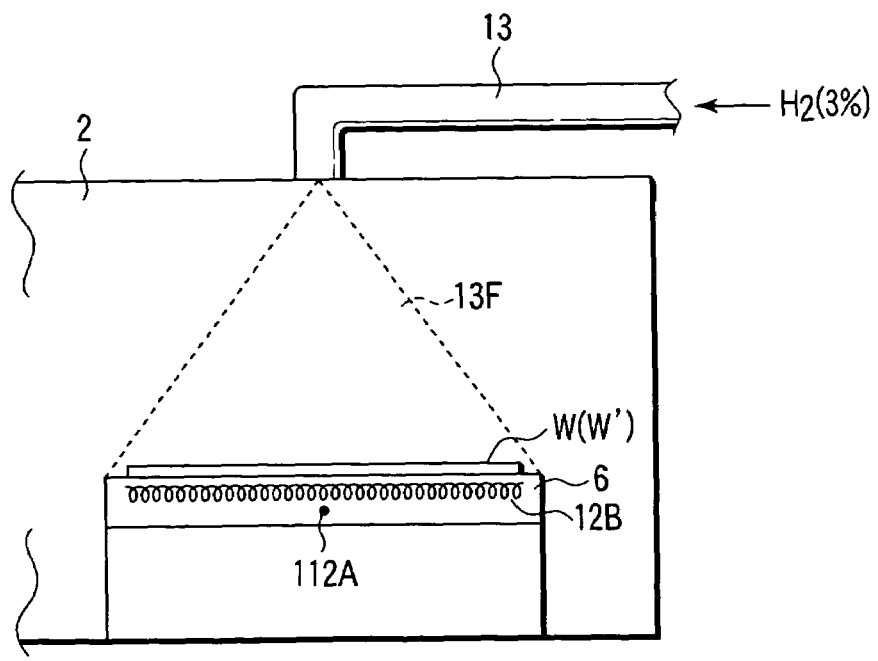
F I G. 4B

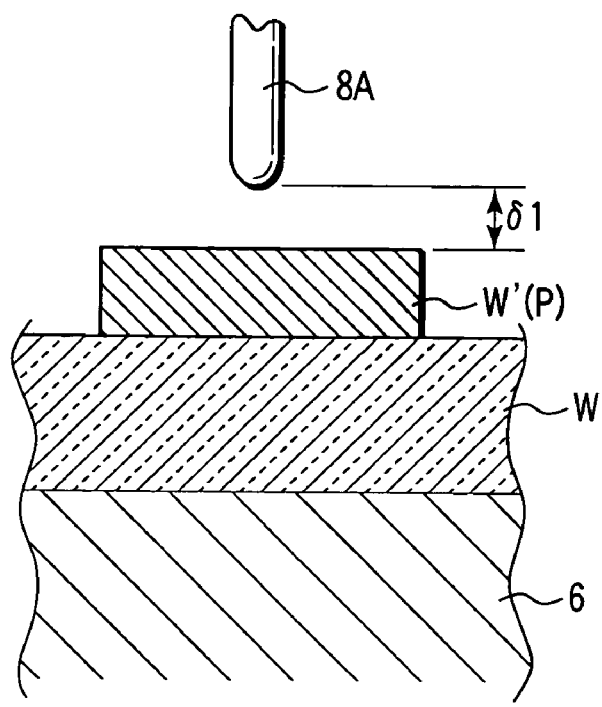
F I G. 5A
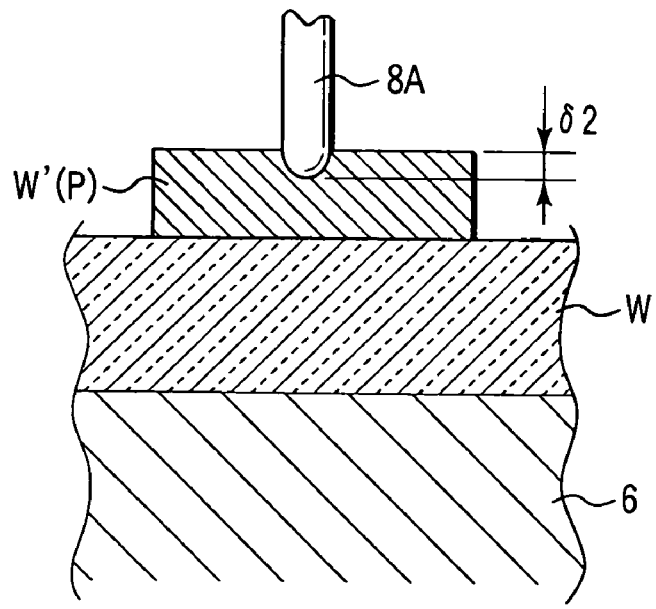
F I G. 5B

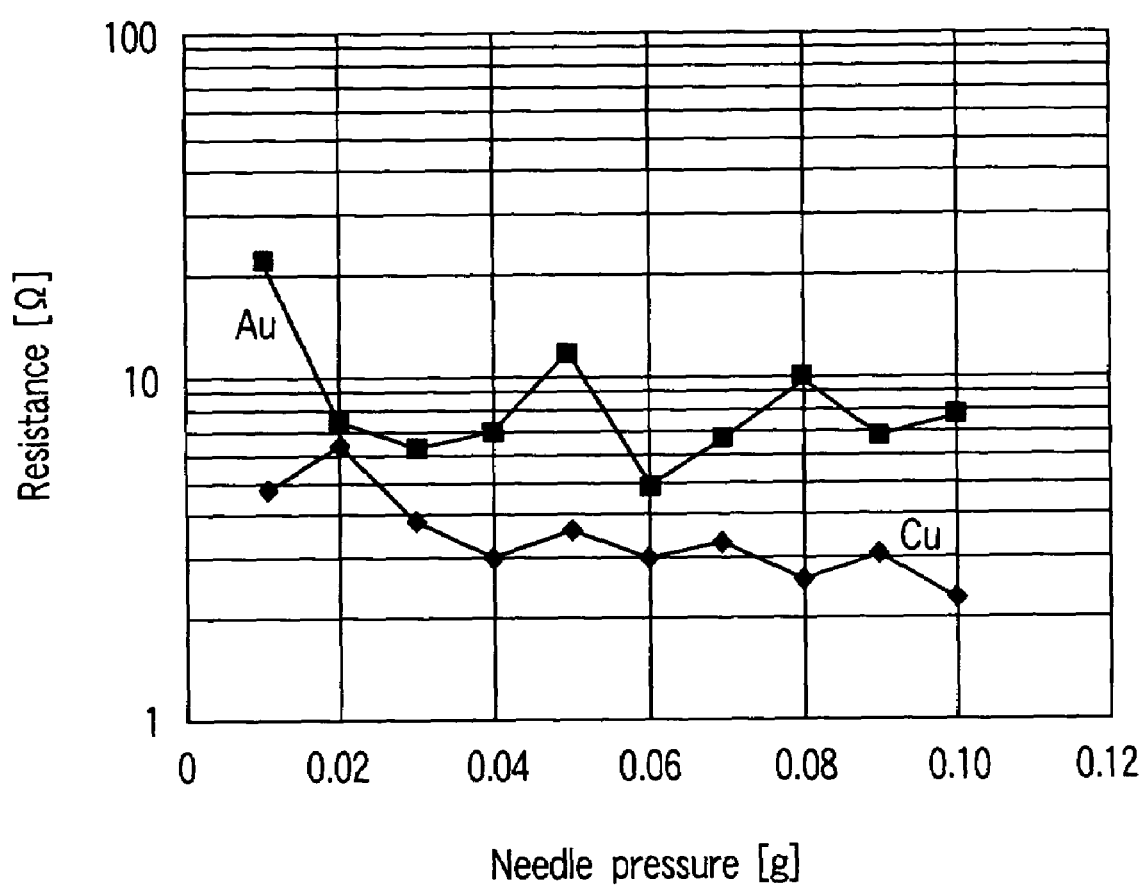
F I G. 6

PROBE PINS ZERO-POINT DETECTING METHOD, AND PROBER

CROSS REFERENCE TO RELATED APPLICATIONS

This is a Continuation Application of PCT Application No. PCT/JP2004/001534, filed Feb. 13, 2004, which was published under PCT Article 21(2) in Japanese.

This application is based upon and claims the benefit of priority from prior Japanese Patent Application No. 2003-042285, filed Feb. 20, 2003, the entire contents of which are incorporated herein by reference.

BACKGROUND OF THE INVENTION

1. Field of the Invention

The present invention relates to a method of detecting the zero point of probe pins accurately, and a prober. Preferably, the present invention relates to probe pins zero-point detecting method which can largely reduce the needle pressure between probe pins and an object to be tested during testing, and a prober which can detect the zero point.

2. Description of the Related Art

In the process of manufacturing a semiconductor device, a prober is used to test the electrical characteristics of devices formed on a wafer. As shown in, e.g., FIGS. 9A and 9B, the prober has a loader chamber 1 which transports a wafer W, and a prober chamber 2 which tests the electrical characteristics of the wafer W moved from the loader chamber 1. The loader chamber 1 has a cassette storing portion 3, a wafer transporting mechanism 4 which transports the wafer W to the loader chamber 1, and a subchuck 5 which prealigns the wafer W with reference to the orientation flat or notch of the wafer W while the wafer transporting mechanism 4 transports the wafer W.

The prober chamber 2 has a stage 6 or which to place the wafer W which is prealigned and moved by the wafer transporting mechanism 4 from the loader chamber 1, a moving mechanism 7 which moves the stage 6 in the X, Y, and Z directions, a probe card 8 arranged above the stage 6, and an alignment mechanism 9 which accurately aligns a plurality of probe pins 8A of the probe card 8 with a plurality of electrode pads of the wafer W on the stage 6. The alignment mechanism 9 has an upper camera 9B which is attached to an alignment bridge 9A and image-senses the wafer W, and a lower camera 9C which is provided to the stage 6 and image-senses the probe pins 8A. The alignment bridge 9A can move from deep in the front surface of the prober chamber 2 to a probe center at the center along a pair of guide rails 9D. This movement is controlled to align the electrode pads of the wafer W with the probe pins 8A.

As shown in FIG. 9A, a test head T is rotatably arranged above a head plate 2A of the prober chamber 2. The test head T and probe card 8 are electrically connected to each other through a performance board (not shown). A test signal from a tester Te is transmitted to the probe pins 8A through the test head T and performance board, and is applied from the probe pins 8A to the electrode pads of the wafer W. On the basis of the test signal, the tester Te tests the electrical characteristics of the plurality of devices formed on the wafer W.

The wafer W and probe pins 8A can be aligned with each other by a conventional known method. More specifically, when the X-Y table 7 moves the stage 6 in the X and Y directions, the lower camera 9C provided to the stage 6 reaches a position immediately below a predetermined probe pin 8A. The stage 6 is vertically moved, so that the lower camera 9C image-senses the needle point of the predetermined probe pin 8A. From the position of the stage 6 at this time, the X-, Y-, and Z-position coordinates of the needle point of the probe pin 8A are calculated. Subsequently, the alignment bridge 9A advances to the probe center, to make the optical axes of the upper camera 9B and lower camera 9C coincide with each other. At this position, the upper camera 9B image-senses a predetermined electrode pad on the wafer W, to calculate the X-, Y-, and Z-position coordinates of the electrode pad. In this manner, alignment of the electrode pad on the wafer W and the predetermined probe pin 8A is ended.

A process of testing the electrical characteristics of a device formed on the wafer W after the alignment is ended will be described hereinafter. The stage 6 moves upward to a preset Z-direction position (referred to as "Z-direction alignment position" hereinafter). The wafer W is overdriven to apply a predetermined needle pressure from the probe pins 8A to the electrode pad on the wafer W. The probe pins 8A and electrode pads are electrically connected to each other. In this state, the tester Te tests the electrical characteristics of the device. After the test, the stage 6 moves downward and the test of this device is ended. The electrical characteristics of the next device on the wafer W are tested by repeating the above process.

The conventional prober can perform alignment in the X and Y directions accurately, as described above. It is, however, difficult to bring the wafer W and probe pins 8A into contact with each other at high accuracy. More specifically, the lower camera 9C image-senses the needle point of the probe pin 8A from immediately below it, to detect the distance between the needle point of the probe pin 8A and the corresponding electrode pad of the wafer W. It is difficult to detect this distance accurately, and sometimes an error occurs. Therefore, it is difficult to accurately obtain a position (referred to as "zero point" hereinafter) where the probe pins 8A and wafer W come into contact with each other almost free of a needle pressure (overdrive amount=0) on the basis of this distance. For example, FIG. 5A shows a state wherein the Z-direction alignment position of the stage 6 which has moved upward is short of size $\delta_1$ with respect to the zero point. In this state, an electrode pad P of the wafer W does not come into contact with the probe pin. Conversely, FIG. 5B shows a state wherein the Z-direction alignment position of the stage 6 has excessively above the zero point by size $\delta_2$. In this state, an excessive needle pressure acts between the probe pins 8A and electrode pads P. Hence, conventionally, the operator sets the error from the Z-direction alignment position to the zero point for each prober on the basis of his or her experience and intuition.

In the prober described in Jpn. Pat. Appln. KOKAI Publication No. 4-340734 (first to sixth lines of column [0013]), decision as to whether or not a needle (probe pin) has come into contact with the electrode of a pellet (device) is performed in the following manner. More specifically, a voltage is applied between two specific probe pins. The specific probe pins are moved close to the electrode surfaces, each covered with a metal layer such as aluminum, of an object to be tested. When the two probe pins come into contact with the electrode surfaces, a current flows between the two probe pins. This current is measured to detect the position where the probe pins come into contact with the electrodes.

In this manner, in the prober described in Jpn. Pat. Appln. KOKAI Publication No. 4-340734, that the electrodes of the device and the probe pins have come into contact with each other is determined on the basis of detection of a current flowing between the two probe pins when the electrodes of the device and probe pins come into contact with each other. An oxide film (electrical insulator) such as a native oxide film is formed on each electrode surface. When the probe pins merely come into contact with the electrode surfaces, no current flows between the two probe pins. To cause a current to flow between the two probe pins, the probe pins must be strongly urged against the electrodes. Thus, the position of the wafer obtained when the current flows between the two probe pins cannot be used as the zero point of the probe pins. Particularly, as the thickness of the wiring layer or the like of the device decreases and the number of layers in the multilayered wiring layer increases these days, the needle pressure for testing may damage the electrode pad and its underlying layer.

The present invention solves at least one of the above problems. The present invention provides probe pins zero-point detecting method which can detect the zero point of probe pins with high accuracy, and preferably which can reliably prevent any damage to the device caused by the needle pressure during testing, and a prober which can detect the zero point.

In Jpn. Pat. Appln. KOKAI Publication No. 2004-156984, the present applicant has proposed a method of detecting the contact position (zero point) of probe pins by bringing the probe pins into contact with a wafer (referred to as a "gold wafer" hereinafter) having a thin gold film surface. According to a later research, the contact resistance between the probe pins and gold wafer was unexpectedly high (see FIG. 6). Consequently, to detect the zero point by bringing the probe pins and gold wafer into contact with each other, apparently, the probe pins must be brought into contact with the gold wafer with at least a needle pressure of approximately 0.5 g/pin. In the future, the film thickness of a device will decrease, the number of layers in the device increase, and the line width of the probe pins decrease, and it will be required to bring the probe pins into contact with the electrode with a much lower needle pressure (e.g., 0.1 g/pin or less). A gold wafer cannot meet such a demand for a lower needle pressure.

The present applicant has made various studies on the conductive film of a zero-point detection plate. As shown in FIG. 6, when reduced copper or equivalent conductive metal (e.g., a copper alloy or other conductive metal) is used as the material of the conductive film, a contact resistance lower than that of gold can be obtained, which will be able to meet the demand for a lower needle pressure in the future. The present invention is based on this finding.

BRIEF SUMMARY OF THE INVENTION

According to the first aspect of the present invention, there is provided, in a method of bringing an electrode of an object to be tested placed on a stage and probe pins into contact with each other, to test electrical characteristics of the object to be tested, a method of detecting a zero point which is a position where an electrode surface of the object to be tested comes into contact with the probe pins. The method comprises: heating a zero-point detection plate (a surface of the zero-point detection plate being made of a conductive material); bringing a reducing gas into contact with the zero-point detection plate to reduce the surface of the zero-point detection plate; cooling the zero-point detection plate in a reducing or inert gas atmosphere; and moving the probe pins close to the surface of the zero-point detection plate to electrically detect that the probe pins has come into contact with the surface.

The method according to the first aspect of the present invention preferably further comprises any one of the following items (a) to (d), or a combination of some of them.
(a) The conductive material that forms the surface of the zero-point detection plate is copper.
(b) The zero-point detection plate is arranged on one of the stage and a support base provided to the stage.
(c) The zero-point detection plate is heated by using at least one of an electric heater and infrared lamp.
(d) The probe pins are reduced before or while being brought into contact with the zero-point detection plate.

According to the second aspect of the present invention, there is provided a prober for testing electrical characteristics of an object to be tested while an electrode of the object to be tested and probe pins are in contact with each other. The prober comprises: a stage (on which places an object to be tested thereon); a probe card (having a plurality of probe pins and arranged to oppose the stage); a zero-point detection plate (a surface of the zero-point detection plate being made of a conductive material, and the zero-point detection plate being used to detect a zero point as a position where an electrode surface of the object to be tested comes into contact with the probe pins); a heating mechanism which heats the zero-point detection plate; and a reducing gas supply mechanism configured to bring a reducing gas into contact with the zero-point detection plate.

The prober according to the second aspect of the present invention preferably further comprises any one of the following items (e) or (g), or a combination of some of them.
(e) The conductive material that forms the surface of the zero-point detection plate is copper.
(f) The zero-point detection plate is arranged on one of the stage and a support base provided to the stage.
(g) A reducing gas supply mechanism which brings a reducing gas into contact with probe pins is provided.

According to the third aspect of the present invention, there is provided a prober for testing electrical characteristics of an object to be tested while an electrode of the object to be tested is in contact with probe pins. The prober comprises: a loader chamber (having a storing portion); a prober chamber; a stage arranged in the prober chamber (the stage serving to place the object to be tested thereon); a probe card arranged in the prober chamber (the probe card including a plurality of probe pins and being arranged to oppose the stage); a stage portion arranged in the prober chamber to place a zero-point detection plate thereon (the zero-point detection plate being used to detect a zero point as a position where an electrode surface of the object to be tested comes into contact with the probe pins, and a surface of the zero-point detection plate being made of a conductive material); a zero-point detection plate arranged in the loader chamber (the zero-point detection plate being arranged in the storing portion set in the loader chamber); a heating mechanism configured to heat the zero-point detection plate; and a reducing gas supply mechanism configured to bring a reducing gas into contact with the zero-point detection plate (the heating mechanism and reducing gas supply mechanism being arranged in at least one of the loader chamber and prober chamber).

The prober according to the third aspect of the present invention preferably further comprises any one of the following items (h) to (j), or a combination of some of them.
(h) The conductive material that forms the surface of the zero-point detection plate is copper.
(i) The heating mechanism includes at least one of an infrared lamp and electroresistive heating mechanism.

(j) A reducing gas supply mechanism which brings the reducing gas into contact with probe pins.

According to the fourth aspect of the present invention, there is provided a storage medium for use in a method of bringing electrodes of an object to be tested placed on a stage and probe pins into contact with each other, to test electrical characteristics of the object to be tested. The storage medium stores at least a program for performing a sequence of detecting a zero point which is a position where electrode surfaces of the object to be tested comes into contact with the probe pins. The sequence comprises: heating a zero-point detection plate, a surface of the zero-point detection plate being made of a conductive material; bringing a reducing gas into contact with the zero-point detection plate to reduce the surface of the zero-point detection plate; cooling the zero-point detection plate in a reducing or inert gas atmosphere; and moving the probe pins close to the surface of the zero-point detection plate to electrically detect that the probe pins has come into contact with the surface.

The storage medium according to the fourth aspect of the invention preferably further comprises any one of the following items (a) to (d), or a combination of some of them.
(a) The conductive material that forms the surface of the zero-point detection plate is copper.
(b) The zero-point detection plate is arranged on one of the stage and a support base provided to the stage.
(c) The zero-point detection plate is heated by using at least one of an electric heater and infrared lamp.
(d) The probe pins are reduced before or while being brought into contact with the zero-point detection plate.

BRIEF DESCRIPTION OF THE SEVERAL VIEWS OF THE DRAWING

FIGS. 1A and 1B are views conceptually showing the main part of a prober according to one embodiment of the present invention, in which FIG. 1A is a plan view of the same, and FIG. 1B is a side view of the same;

FIGS. 3A, 3B, and 3C are views for explaining probe pins zero-point detecting method according to one embodiment of the present invention, in which FIG. 3A is a view showing how to detect a probe pin with a lower camera, FIG. 3B is a view showing how to detect a support base with an upper camera, and FIG. 3C is a view showing how to detect a zero point by bringing a zero-point detection plate and probe pins into contact with each other;

FIGS. 4A and 4B are side views conceptually showing the main parts of probers according to other embodiments of the present invention, respectively;

FIGS. 5A and 5B are schematic views each showing the relationship between a Z-direction alignment position and probe pin;

FIG. 6 is a graph showing the contact resistances of gold and copper in comparison;

FIGS. 9A and 9B are views showing an example of a conventional prober, in which FIG. 9A is a cutaway front view showing the front portion of a prober chamber, and FIG. 9B is a plan view showing the interior of the prober.

DETAILED DESCRIPTION OF THE INVENTION

Figure 1A:
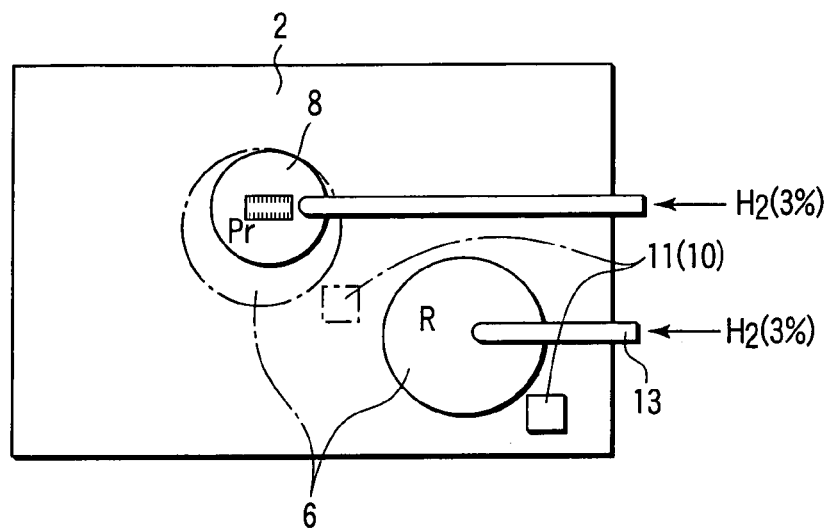

The characteristic features of the present invention will now be mainly described on the basis of the first embodiment shown in FIGS. 1A to 5B by denoting the same or corresponding portions as in the prior art with the same reference numerals.

Figure 1B:
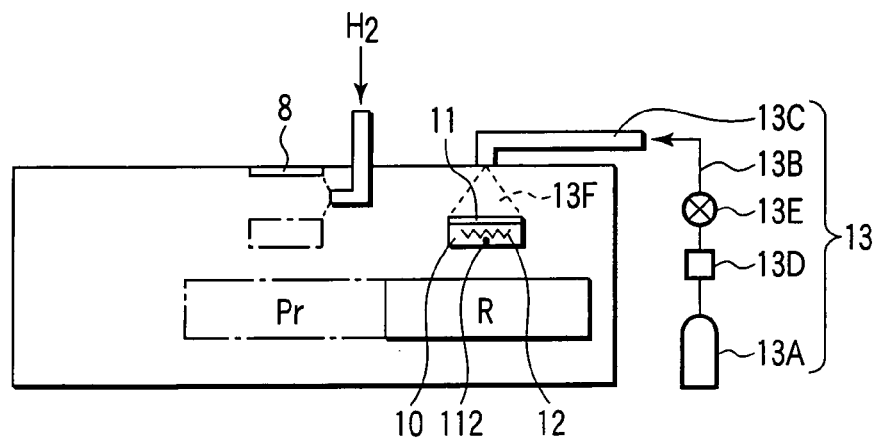
Figure 2:
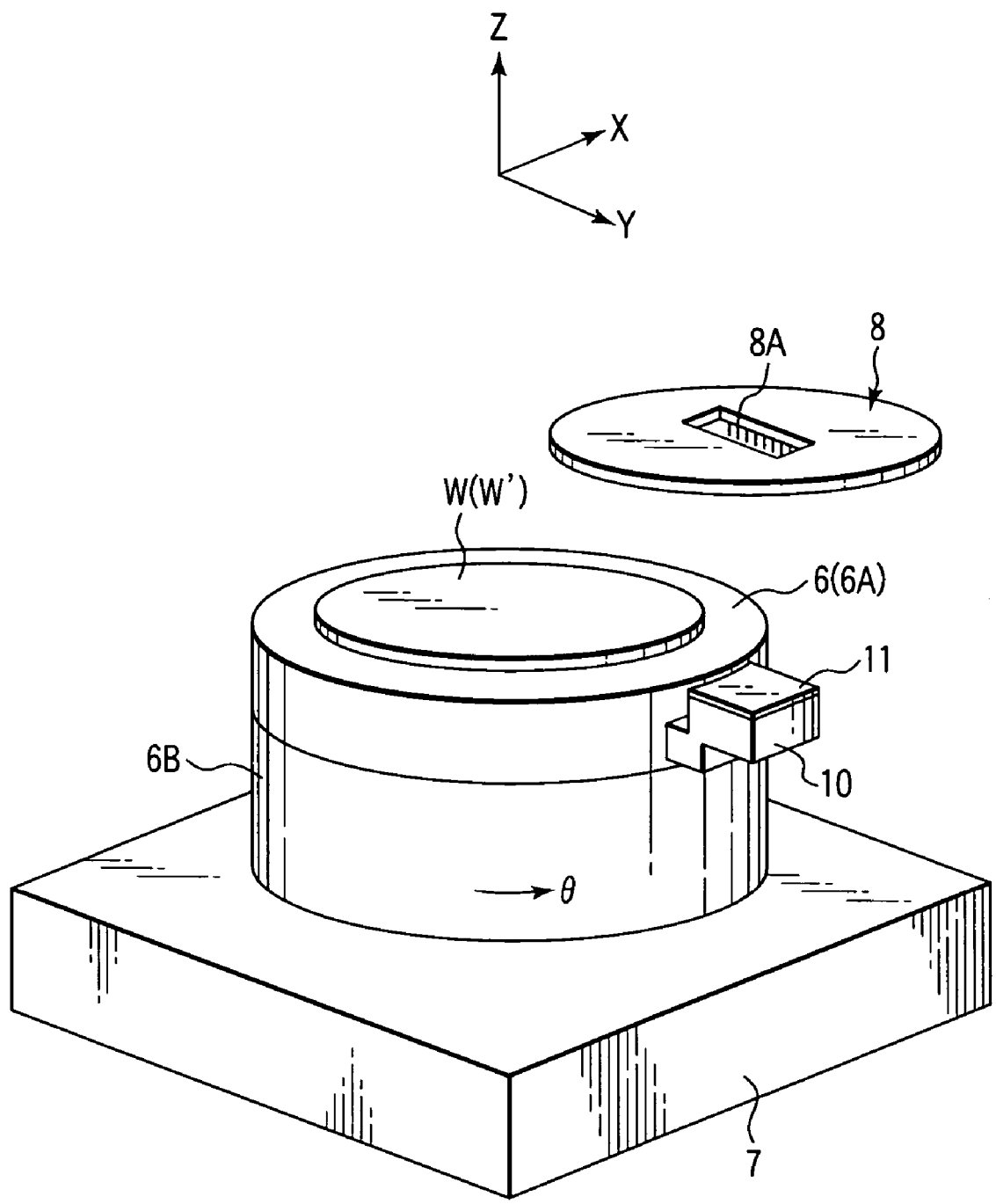
FIG. 2 is a perspective view showing the relationship among a stage, support base, and probe card in the prober shown in FIG. 1.

A prober of this embodiment is formed in the same manner as that of a conventional prober except that it has a zero-point detection plate 11 and a reducing mechanism (12, 13) in a prober chamber 2 as shown in, e.g., FIGS. 1A, 1B, and 2. More specifically, the prober chamber 2 has a stage 6 which places a wafer W thereon and moves in the horizontal and vertical directions, a moving mechanism 7 and rotary mechanism 6B which move the stage 6 in the X, Y, and Z directions and in a θ direction, respectively, and a probe card 8 which is arranged above the stage 6 and has a plurality of probe pins 8A. In the prober chamber 2, the probe pins 8A are brought into contact with electrodes P (FIG. 5A) of an object W' to be tested (e.g., device) on the wafer W, and the electrical characteristics of the object W' to be tested are tested in the same manner as in the prior art (FIG. 5B).

As shown in FIGS. 1A, 1B, and 2, a support base 10 is provided to the stage 6. The upper surface of the support base 10 is preferably horizontal, in the same manner as the stage surface of the stage 6. The support base 10 is moved together with the stage 6 in the X, Y, Z, and θ directions by the moving mechanism 7 and rotary mechanism 6B. The zero-point detection plate 11 having a surface made of a conductive material (e.g., reduced copper) may be arranged on the upper surface of the support base 10. When the two probe pins 8A of the probe card 8 come into contact with the zero-point detection plate 11, a current flows between the two probe pins 8A. By detecting this phenomenon, the zero point of the needle point can be detected. The zero-point detection plate 11 can be exchanged when any problem occurs with it.

Figure 7:
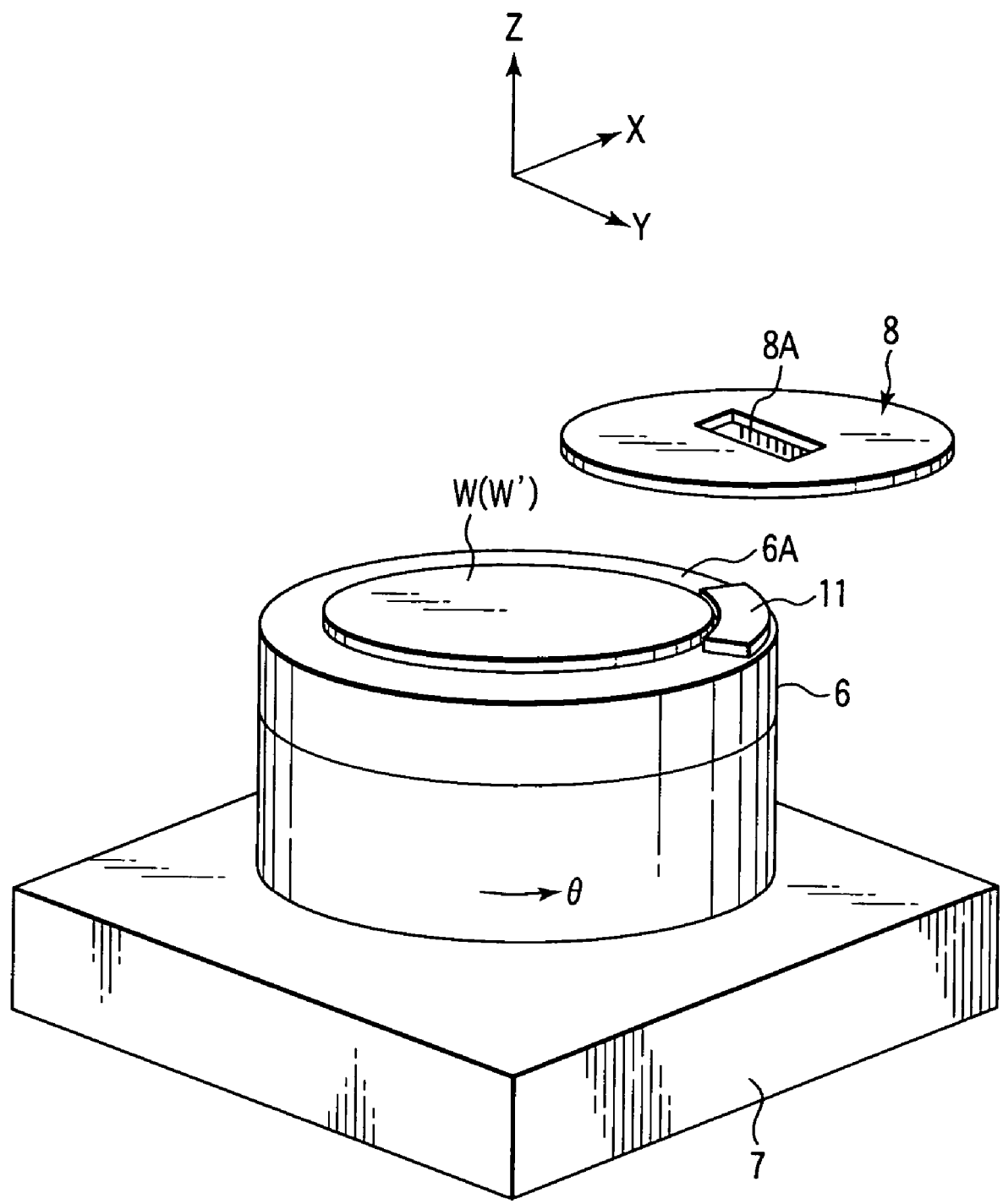
FIG. 7 is a perspective view showing a case wherein a zero-point detection plate 11 is placed on the stage of the prober shown in FIG. 1.

FIG. 7 shows another embodiment in which a zero-point detection plate 11 is arranged on a surface 6A of a stage 6. In this embodiment, the structure and operation of portions other than the zero-point detection plate 11 are basically the same as those of the embodiment shown in FIG. 2.

Note that in FIG. 1B, only the movement of the support base 10 and zero-point detection plate 11 is shown and the stage 6 is omitted.

The material of the conductive film on the surface of the zero-point detection plate 11 is not particularly limited as far as it is made of a conductive material equivalent to reduced copper. Accordingly, the zero-point detection plate 11 itself may be made of reduced copper or a copper alloy. Alternatively, for example, the zero-point detection plate 11 may be made of a silicon substrate having a surface covered with reduced copper or a copper alloy (a conductive metal such as reduced copper or a copper alloy will be described as "copper" hereinafter). Note that copper tends to form copper oxide in the atmosphere and accordingly the conductivity of the surface is lost over time.

In view of this, according to this embodiment, the zero-point detection plate 11 is used after the copper oxide surface formed on the surface of reduced copper of the zero-point detection plate 11 is reduced so that it is restored to reduced copper. More specifically, as shown in FIG. 1B, a heating mechanism 12 arranged in the support base 10 preferably heats the zero-point detection plate 11 to almost a reduceable temperature (e.g., 200° C. to 350° C.). The structure of the heating mechanism 12 is not particularly limited. For example, the heating mechanism 12 can use an infrared lamp or electroresistive heater.

As shown in FIGS. 1A and 1B, and as noted above, a gas supply mechanism can be provided to supply a reducing gas into contact with probe pins on the probe card 8. FIGS. 1A and 1B also show a separate gas supply mechanism 13 which brings a reducing gas (e.g., gas containing hydrogen) into contact with the surface of the zero-point detection plate is preferably arranged in the prober chamber 2. The reducing gas is blown from the gas supply mechanism 13 to the zero-point detection plate 11 heated to a reducing temperature to reduce the copper oxide surface of the zero-point detection plate 11. The amount of hydrogen gas in the reducing gas is not particularly limited, but preferably the hydrogen gas concentration falls within an non-explosive range of 4% or less. For example, a forming gas containing about 3% of hydrogen gas can be used. The forming gas is preferably supplied for 5 mm to 30 mm at a flow rate of, e.g., 1 L/min to 5 L/min. The hydrogen gas may be preheated to be activated, and may be supplied. A hydrogen gas plasma obtained by plasmatizing hydrogen gas by using an atmosphere plasma device may be used.

As shown in, e.g., FIGS. 1A and 1B, the gas supply mechanism 13 can have a gas supply source 13A, pipe 13B, gas blowing portion 13C, mass flow controller 13D, and valve 13E. The forming gas is blown from the gas blowing portion 13C toward the zero-point detection plate 11 while adjusting the flow rate of the forming gas with the mass flow controller 13D, so that the copper oxide surface is reduced. To heat or activate the hydrogen gas, a heating mechanism may be interposed midway along the pipe.

A probe pins zero-point detecting method according to one embodiment of the present invention will be described with reference to FIGS. 1A to 3C. Prior to testing the object to be tested, the copper oxide surface of the zero-point detection plate 11 is reduced. More specifically, the heating mechanism 12 in the support base 10 heats the zero-point detection plate 11 to almost the reducing temperature (e.g., 300° C.) for copper oxide. During this heating, the support base 10 provided to the stage 6 moves together with the stage 6, and is positioned in a reducing area R immediately under the gas blowing portion 13C, as shown in FIG. 1B. Subsequently, the valve 13E of the gas supply mechanism 13 is opened and the forming gas is blown toward the zero-point detection plate 11 with the mass flow controller 13D at a flow rate of 2 L/min. As the zero-point detection plate 11 is already heated to almost the reducing temperature of copper oxide, copper oxide on the surface of the zero-point detection plate 11 is reduced. When the forming gas is supplied for, e.g., 20 min, copper oxide on the surface of the zero-point detection plate 11 is completely reduced, so that the zero-point detection plate 11 restores its conductivity. After that, power to the heating mechanism 12 is disconnected and the zero-point detection plate 11 is cooled to, e.g., 50° C. or less. The temperature is checked by a temperature detection means 112 inserted in the support base 10. Preferably, the forming gas is kept supplied during cooling. It suffices as far as an atmosphere where reoxidation does not progress is maintained, and an inert gas may be supplied. The reduced zero-point detection plate 11 can be used for about 1 hr for zero point detection.

Figure 3A:
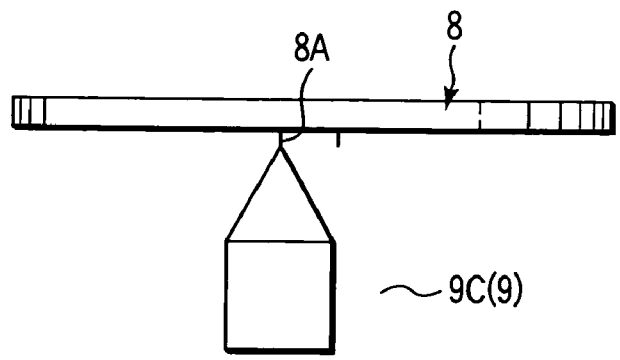
Figure 3B:
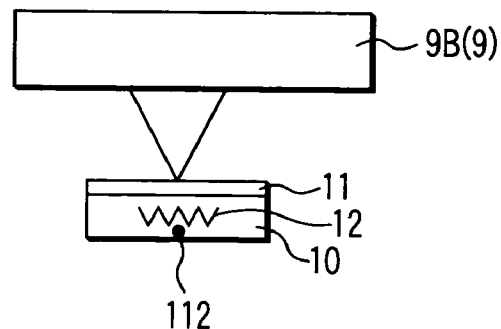

After that, the stage 6 is moved by the X-Y table 7 from the reducing area R to a test area Pr. As shown in FIG. 3A, a probe pin 8A is detected with a lower camera 9C of an alignment mechanism 9. Subsequently, the alignment bridge of the alignment mechanism 9 is moved to the probe center under the probe card 8, and then the stage 6 is moved by the moving mechanism 7 in the X and Y directions. During this movement, when an upper camera 9B detects the support base 10, as shown in FIG. 3B, the stage 6 is stopped.

Figure 3C:
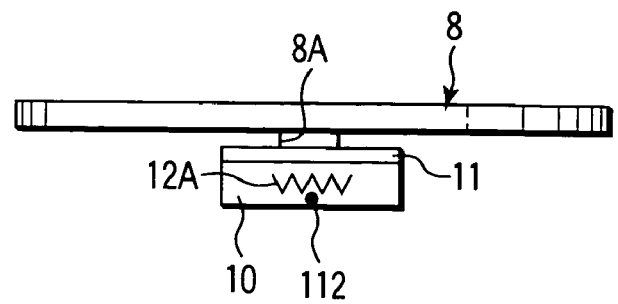

Subsequently, the alignment bridge moves backward to return to the initial position. While a voltage is applied to the probe card 8, the stage 6 is moved upward by an elevating mechanism to a preset Z-direction alignment position. If the probe card 8 does not reach the Z-direction alignment position, the operator operates a controller to move the stage 6 upward, so that the zero-point detection plate 11 and probe pins 8A come into contact with each other, as shown in FIG. 3C. When the contact resistance of the probe pins 8A stabilizes, the elevating driving mechanism is stopped. The Z-direction coordinate position of the stage 6 at this time is determined as the zero point of the needle points of the probe pins 8A.

Conversely, if the Z-direction alignment position of the stage 6 exceeds the zero point, the contact resistance between the probe pins 8A decreases at once. The operator moves the stage 6 downward gradually, and stops it immediately before the contact resistance becomes unstable. The coordinate position at this time is determined as the zero point.

After the zero point is detected in the above manner, the wafer W is transported from the loader chamber onto the stage 6 in the prober chamber 2 in the same manner as in the prior art. After the probe card 8 and wafer W are aligned by the alignment mechanism 9, the electrical characteristics of the wafer W are tested. At this time, according to this embodiment, since the zero point where the electrode pads on the object to be tested on the wafer W and the probe pins 8A come into contact with each other is detected accurately, the electrodes and the probe pins 8A can be brought into contact with each other accurately at the zero point. As a result, the needle pressure during testing can be more greatly decreased than in the prior art.

As described above, according to the first embodiment, the zero point of the needle points of the probe pins 8A can be detected with a needle pressure which is lower than in a case wherein a gold wafer is used. Any damage caused to the device by the probe pins 8A when testing a thin, multilayered object to be tested can be decreased, so that a highly reliable test can be performed. Also, the overdrive amount produced when the wafer W is overdriven can be managed highly accurately.

A second embodiment of the present invention will be described. According to this embodiment, as shown in FIGS. 4A and 4B, a copper wafer having a surface made of copper can be used as a zero-point detection plate 11A. The zero-point detection plate 11A can be stored in a storing portion 1A (FIG. 8A) in a loader chamber 1. When a stage 6 has a heating mechanism for high-temperature testing of a wafer W, the heating mechanism can be used as a heating mechanism for reducing the copper wafer. As a gas supply mechanism 13, a type which is arranged in a prober chamber 2 in the same manner as in the above embodiment can be used.

A zero point detecting method according to the second embodiment will be described. The zero-point detection plate 11A is extracted from the loader chamber and placed on the stage 6 in the prober chamber. The zero-point detection plate 11A may be heated by an electroresistive heating mechanism 12A of the stage 6 to a temperature that can reduce copper oxide. The stage 6 moves to position the zero-point detection plate 11A immediately under a gas blowing portion 13C, as shown in FIG. 4A. Subsequently, a forming gas is blown from the gas supply mechanism 13 toward the zero-point detection plate 11A at a predetermined flow rate for a predetermined period of time, in the same manner as in the above embodiment, to reduce copper oxide of the zero-point detection plate 11A. After that, power to the heating mechanism 12A is disconnected, and the zero-point detection plate 11A is cooled to, e.g., 50° C. or less. Preferably, the forming gas is kept supplied during cooling. It suffices as far as an atmosphere where reoxidation does not progress is maintained, and an inert gas may be supplied. The temperature is checked by a temperature detection means 112A inserted in the stage 6.

Subsequently, while a voltage is applied to a probe card 8, the stage 6 moves from a reducing area (R) shown in FIG. 1A to a test area (Pr) immediately below the probe card. In this state, the stage 6 moves upward to bring the zero-point detection plate 11A and the probe pins of the probe card 8 into contact with each other. The zero point of the probe pins is detected in the same manner as in the above embodiment. After the zero point is detected, the zero-point detection plate 11A is transported from the stage 6 to a storing location in the loader chamber, and the wafer W is transported from the cassette to the stage 6, in the same manner as in the prior art. Then, the electrical characteristics of the object to be tested are tested.

FIG. 4B shows the third embodiment. In the embodiment shown in FIG. 4B, a heating mechanism 12B provided to a stage 6 uses an infrared lamp. The third embodiment shown in FIG. 4B can be the same as the embodiment shown in FIG. 4A except for the heating mechanism 12B.

An electroresistive heating mechanism 12A and infrared-lamp heating mechanism 12B can be employed in combination.

Figure 8A:
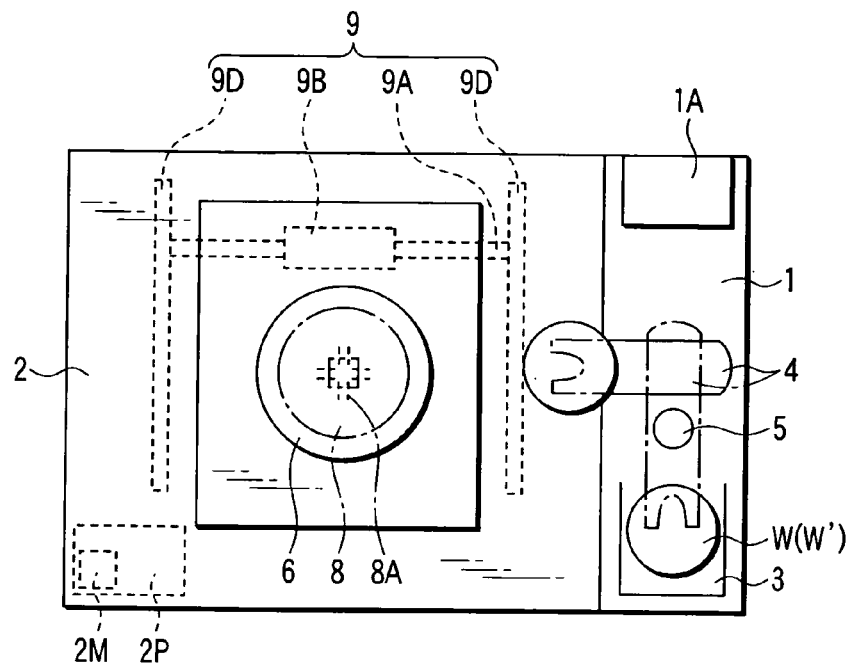
FIGS. 8A, 8B, and 8C are views each showing a prober in which a storing portion 1A to store a zero-point detection plate is arranged in a loader chamber.

The fourth embodiment will be described. According to this embodiment, a storing portion 1A which stores a zero-point detection plate is arranged in a loader chamber, as shown in FIG. 8A. As a zero-point detection plate 11A, the copper wafer shown in FIG. 4A can be employed.

Figures 8B, 8C:
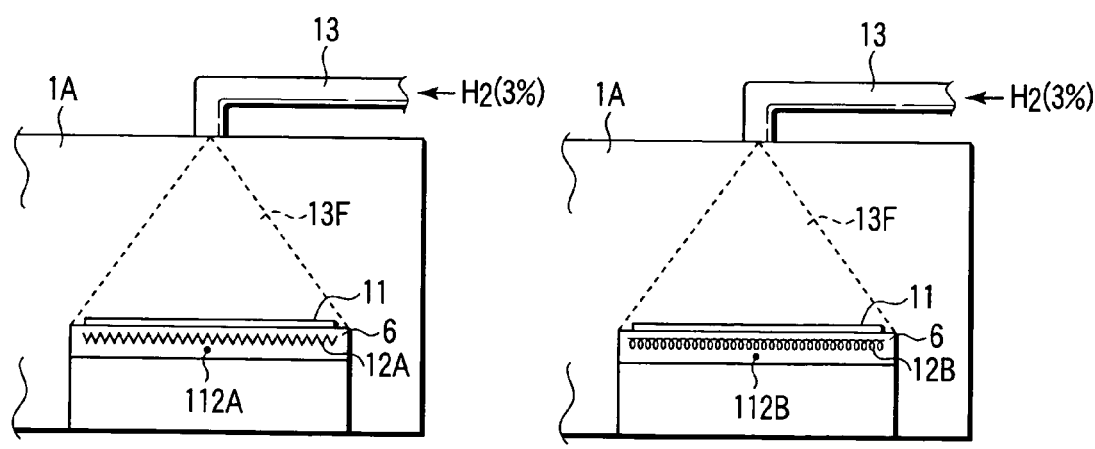
Figure 9A:
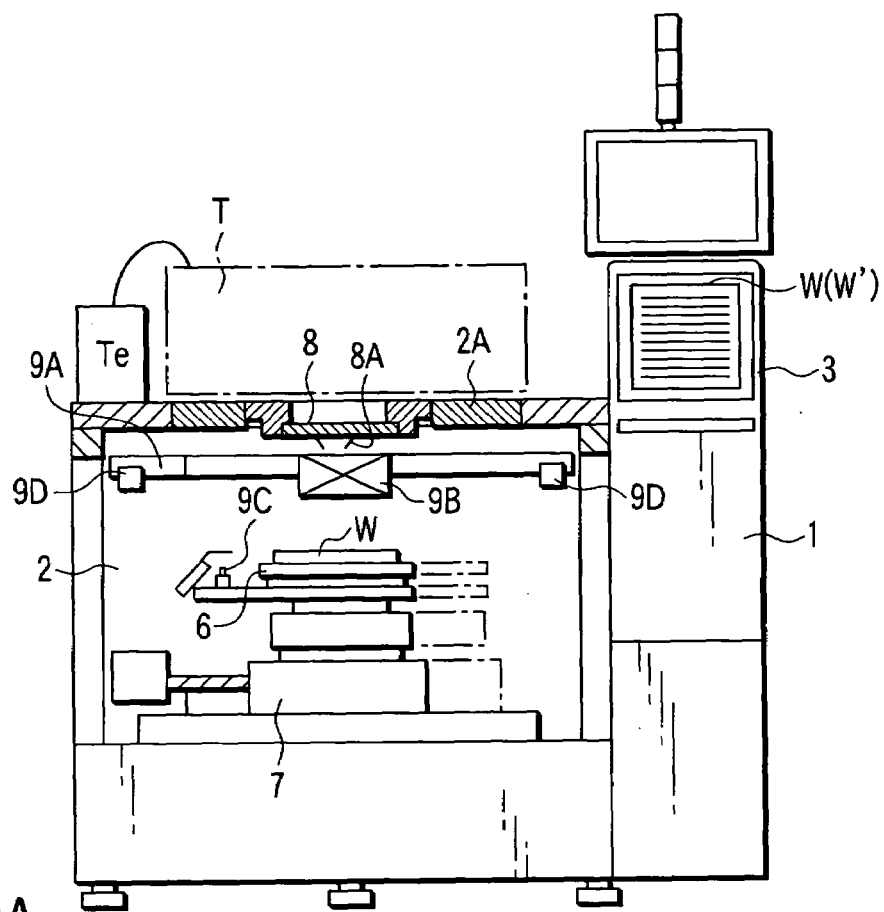
Figure 9B:
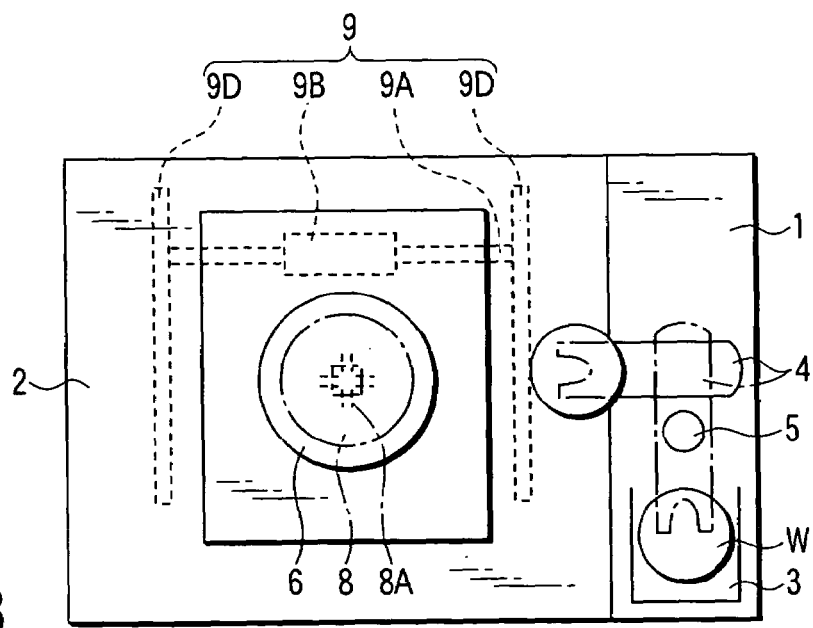

As shown in FIG. 8B, an electroresistive heating mechanism 12A to heat the zero-point detection plate 11A can be arranged in the loader chamber (e.g., in a storing portion 1A). Similarly, the heating mechanism can be a lamp 12B, as shown in FIG. BC.

A reducing gas supply mechanism 13 can be arranged in the storing portion 1A.

When the heating mechanism and reducing gas supply mechanism are to be arranged in the storing portion 1A, the copper wafer is heated and blown with a reducing gas in the storing portion 1A, as shown in FIG. 8A, so that the copper oxide surface on the copper wafer is reduced to form reduced copper. The copper wafer in this state is transported from a loader chamber 1 to a prober chamber 2 and is placed on a stage. The zero point can be detected, in the same manner as in the embodiment shown in FIG. 4A, by using this copper wafer.

In any of the embodiments described above, a computer can control the sequence of steps. The computer 2P (See FIG. 8A) can acquire a program for performing the sequence, from a storage medium 2M (See FIG. 8A) that stores the program. The computer can then control the sequence in accordance with the program.

As has been described above, the zero point of the probe pins of the probe card 8 can be detected highly accurately in any of the above embodiments.

The present invention is not limited to the embodiments described above. For example, in the first embodiment, of detection of the zero point by using the zero-point detection plate 11 and transportation of the wafer onto the stage, either one can be performed prior to the other.

A process of blowing hydrogen gas to the probe so that the distal end of the probe is reduced may be performed before or during bringing the probe into contact with the zero-point detection plate.

According to the embodiments of the present invention, the zero point of the probe pins can be detected highly accurately. Accordingly, a probe pin zero-point detecting method which can reliably prevent any damage to the device caused by the needle pressure during testing, and a prober can be provided.

What is claimed is:

1. A prober for testing electrical characteristics of an object to be tested while electrodes of the object to be tested and probe pins are in contact with each other, the prober comprising:
   a stage which places an object to be tested thereon;
   a probe card having a plurality of probe pins and arranged to oppose the stage;
   a zero-point detection plate, a surface of the zero-point detection plate being made of a conductive material, the zero-point detection plate being used to detect a zero point as a position where an electrode surfaces of the object to be tested comes into contact with the probe pins;
   a heating mechanism which heats the zero-point detection plate; and
   a reducing gas supply mechanism configured to bring a reducing gas into contact with the zero-point detection plate.

2. A prober according to claim 1, wherein the conductive material that forms the surface of the zero-point detection plate is copper.

3. A prober according to claim 1, wherein the zero-point detection plate is arranged on one of the stage and a support base provided to the stage.

4. A prober according to claim 1, further comprising a reducing gas supply mechanism which brings a reducing gas into contact with probe pins.

5. A prober according to claim 1, further comprising a loader chamber having a storing portion, wherein the zero-point detection plate is arranged in the storing portion set in the loader chamber.

6. A prober according to claim 1, further comprising:
   a loader chamber having a storing portion, wherein the zero-point detection plate is arranged in the storing portion set in the loader chamber and the heating mechanism and reducing gas supply mechanism are arranged in at least one of the loader chamber and a prober chamber.

7. a prober according to claim 1, wherein the heating mechanism comprises at least one of an infrared lamp and electroresistive heating mechanism.

* * * * *